(12) United States Patent
Peng et al.

(10) Patent No.: US 7,779,894 B2
(45) Date of Patent: Aug. 24, 2010

(54) HEAT DISSIPATION DEVICE

(75) Inventors: Jie-Bo Peng, Shenzhen (CN); Jin-Gong Meng, Shenzhen (CN); Ching-Bai Hwang, Tu-Cheng (TW); Jui-Wen Hung, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 1059 days.

(21) Appl. No.: 11/309,354

(22) Filed: Jul. 31, 2006

(65) Prior Publication Data

US 2008/0023176 A1 Jan. 31, 2008

(51) Int. Cl.
*H05K 7/20* (2006.01)

(52) U.S. Cl. .................. 165/80.3; 165/122; 165/104.33; 361/697

(58) Field of Classification Search ................ 165/80.3, 165/104.33, 121, 122, 185; 361/697
See application file for complete search history.

(56) References Cited

U.S. PATENT DOCUMENTS

| | | | |
|---|---|---|---|
| 6,650,540 B2 * | 11/2003 | Ishikawa | 361/695 |
| 7,327,568 B2 * | 2/2008 | Lin | 361/679.48 |
| 2003/0081382 A1 * | 5/2003 | Lin | 361/697 |
| 2004/0001316 A1 * | 1/2004 | Kamikawa et al. | 361/700 |
| 2004/0057205 A1 * | 3/2004 | Chen et al. | 361/687 |
| 2004/0114328 A1 | 6/2004 | Chiou | |
| 2005/0195569 A1 * | 9/2005 | Hsu | 361/697 |
| 2006/0039113 A1 * | 2/2006 | Cheng et al. | 361/700 |
| 2006/0232933 A1 * | 10/2006 | Wang et al. | 361/697 |
| 2007/0119566 A1 * | 5/2007 | Peng | 165/80.3 |
| 2007/0188992 A1 * | 8/2007 | Hwang et al. | 361/700 |
| 2008/0017349 A1 * | 1/2008 | Li et al. | 165/80.3 |

\* cited by examiner

*Primary Examiner*—Allen J Flanigan
(74) *Attorney, Agent, or Firm*—Jeffrey T. Knapp

(57) ABSTRACT

A heat dissipation device includes a heat sink (10) and a blower (50) for generating an airflow to the heat sink. The blower includes a housing (60) and at least one plate (63a, 63b) extending outwardly from the housing. The housing forms a contacting surface (610, 620) abutting a side of the heat sink. The plate includes an inner surface (630) abutting another side of the heat sink. A groove (69) is defined in a junction of the housing and the plate, and thus the contacting surface of the housing and the inner surface of the plate are planar-shaped to avoid interference between the housing of the blower and the heat sink. The groove has chamfer angles R therein. The housing is made by plastic injection molding or die casting.

17 Claims, 4 Drawing Sheets

HEAT DISSIPATION DEVICE

FIELD OF THE INVENTION

The present invention relates generally to a heat dissipation device, and in particular to a heat dissipation device with improved fan housing which a heat sink can be conveniently mounted on.

DESCRIPTION OF RELATED ART

With the advance of large scale integrated circuit technology, and the widespread use of computers in all trades and occupations, in order to meet the required improvement in data processing load and request-response times, high speed processors have become faster and faster, which causes the processors to generate excess heat. Excess heat which is not quickly removed will have disruptive influence on the system security and performance. Usually, a heat sink is installed on the central processor to assist its heat dissipation, whilst a cooling fan is also used to provide a forced airflow which increases heat dissipation.

A blower is more suitably used in a notebook since it has a flat configuration and a large air flow rate. The blower includes a motor and a housing receiving the motor therein. A pair of flanges extend outwardly from the housing and define a space for receiving the heat sink. However, the flanges are usually integrally formed with the housing by plastic injection molding or die casting, chamfer angles are formed at the junctions of the housing and the flanges. The heat sink includes a plurality of stacked fins and has a cuboid profile. During assembly, the heat sink interferes with the flanges and the housing due to the chamfer angle formed at the junction of the housing and the flanges. As a result the heat sink can not be fixedly and closely mounted into the housing. A narrow gap may easily form between the heat sink and the housing of the blower. Furthermore, the heat sink may interfere with other components mounted in an enclosure of the notebook due to the inability of the heat sink to fittingly engage with the housing of the blower. Therefore it is difficult to precisely assemble the heat sink. On the other hand, part of the forced airflow generated by the blower escapes from the heat sink through the gap, and thus the airflow can not be sufficiently utilized to dissipate heat of the heat sink absorbed form the heat-generating device.

What is needed, therefore, is a heat dissipation device which has a blower and a heat sink wherein the heat sink can be conveniently and precisely assembled to a housing of the blower.

SUMMARY OF THE INVENTION

According to a preferred embodiment of the present invention, a heat dissipation device includes a heat sink for thermally connecting with a heat-generating device and a blower for generating an airflow to the heat sink. The blower includes a housing and at least one plate extending outwardly from the housing. The housing forms a contacting surface abutting a side of the heat sink. The plate includes an inner surface abutting another side of the heat sink. A groove is defined in a junction of the housing and the plate, and thus the contacting surface of the housing and the inner surface of the plate are spaced from each other and are planar-shaped to avoid interference between the housing of the blower and the heat sink. Thus the heat sink can be fixedly and fittingly mounted into the housing. Also the heat sink can be closely attached to the housing and thus airflow leakage can be avoided. Therefore the heat dissipation device can be more conveniently assembled and can achieve a high heat dissipation efficiency.

Other advantages and novel features of the present invention will be drawn from the following detailed description of the preferred embodiment of the present invention with attached drawings, in which:

BRIEF DESCRIPTION OF THE DRAWINGS

Many aspects of the present heat dissipation device can be better understood with reference to the following drawings. The components in the drawings are not necessarily drawn to scale, the emphasis instead being placed upon clearly illustrating the principles of the present heat dissipation device. Moreover, in the drawings, like reference numerals designate corresponding parts throughout the several views.

DETAILED DESCRIPTION OF THE INVENTION

Figure 1:
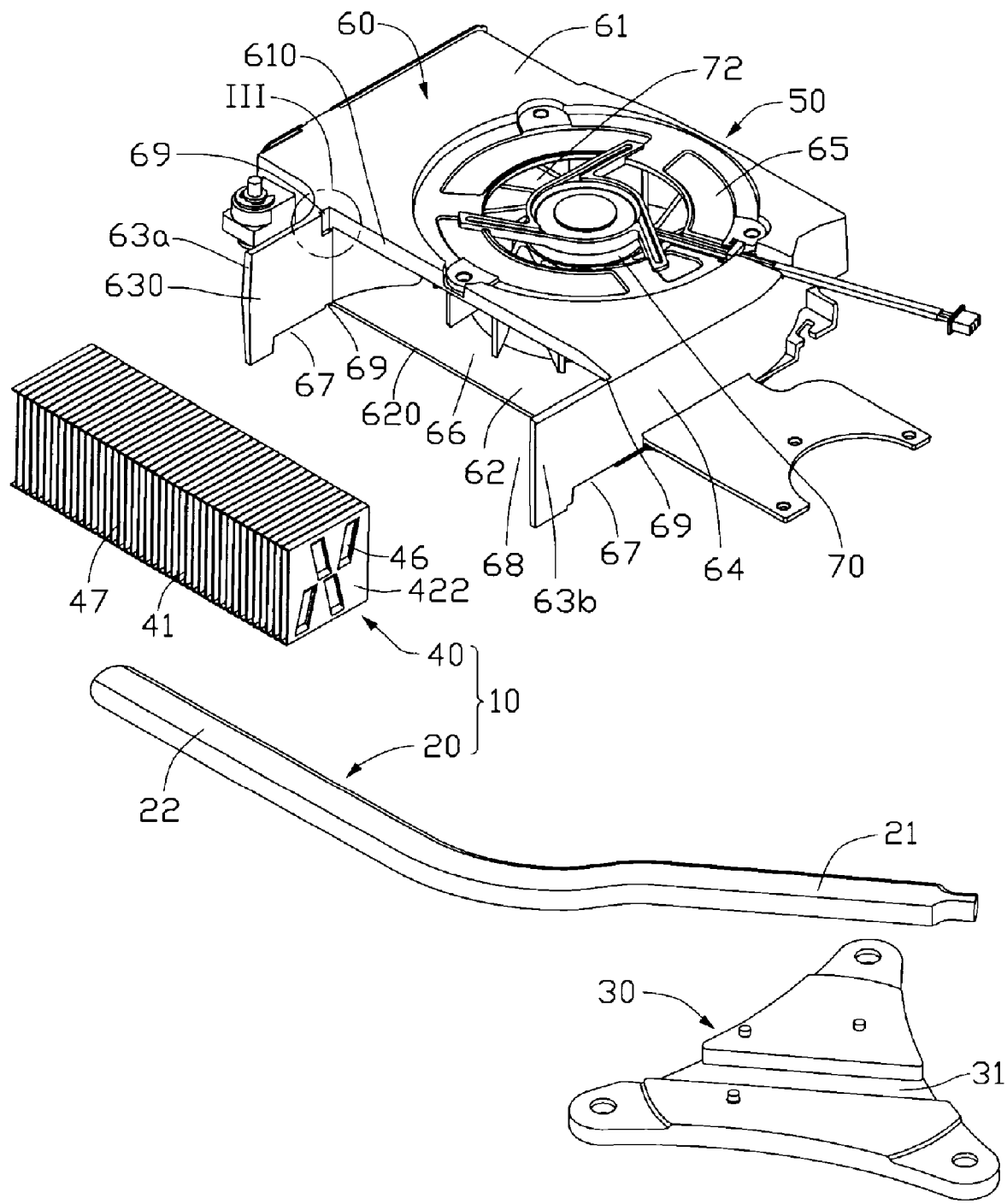
FIG. 1 is an explored, isometric view of a heat dissipation device in accordance with a preferred embodiment of the present invention.
Figure 2:
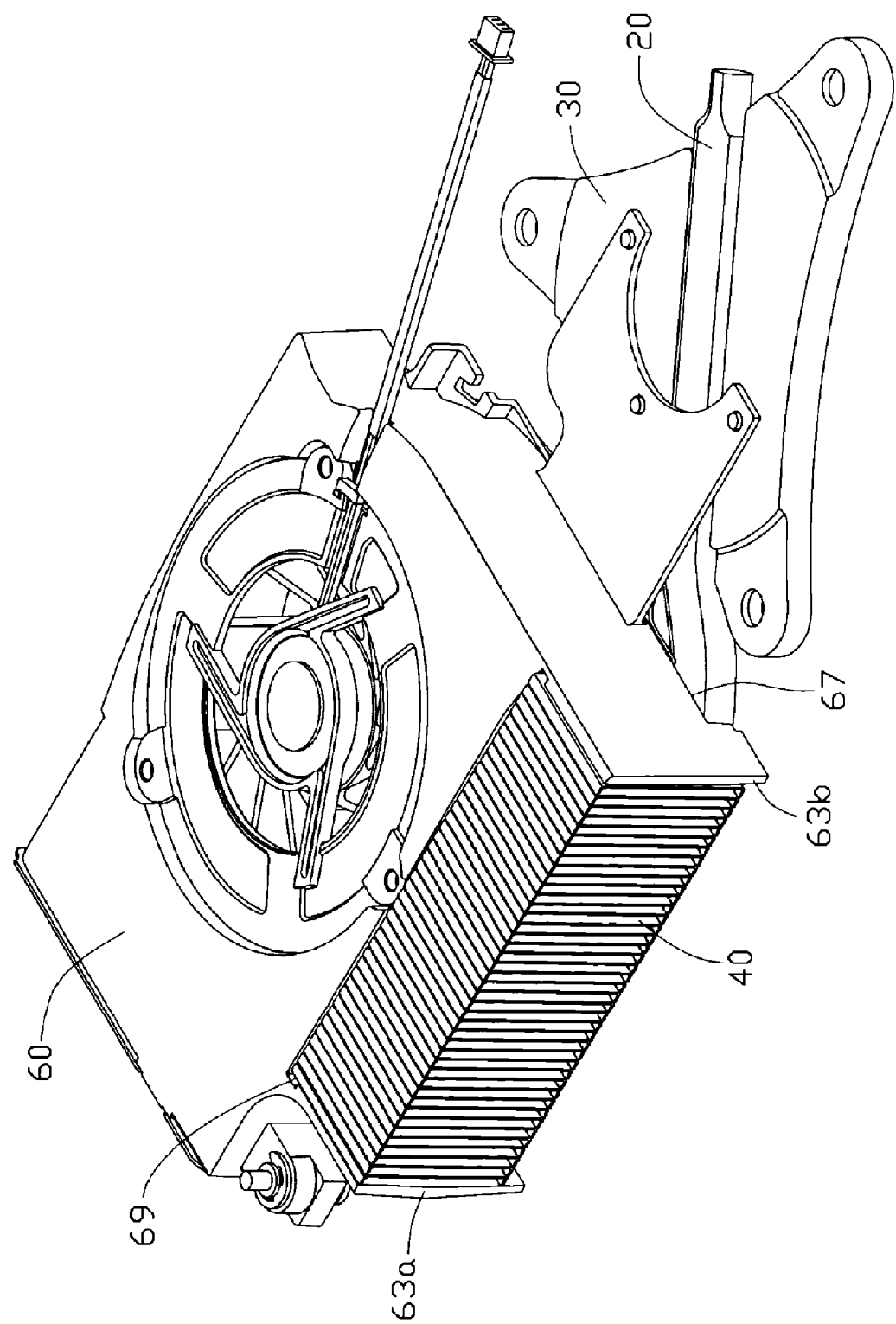
FIG. 2 is an assembled, isometric view of the heat dissipation device of FIG. 1.

Referring to FIGS. 1-2, a heat dissipation device includes a heat sink 10 and a fan blower 50 arranged at a side of the heat sink 10. The heat sink 10 includes a fin unit 40 and a heat pipe 20 for transferring heat of a heat-generating device, for example, a central processing unit (CPU, not shown) to the fin unit 40.

The blower 50 includes a housing 60 and a motor 70 having a plurality of blades 72 extending radially and outwardly form an outer-periphery thereof. The housing 60 is integrally formed by plastic injection molding or die casting and includes a top cover 61 arranged at a top side of the motor 70, a bottom cover 62 arranged at a bottom side of the motor 70 parallel to the top cover 61, and a sidewall 64 interconnecting between the top and bottom covers 61, 62 and surrounding the motor 70. The two covers 61, 62 and the sidewall 64 cooperatively define a space (not labeled) for receiving the motor 70 therein. An air inlet 65 is defined in a central portion of the top cover 61. An air outlet 66 is defined in the sidewall 64 of the housing 60 and is oriented to be perpendicular to the air inlet 65.

Left and right plate 63a, 63b extend outwardly from two opposite sides of the air outlet 66 of the sidewall 64. The two plates 63a, 63b each have an inner surface 630 facing and parallel to each other. A chamber 68 is defined between the two inner surfaces 630 of the two plates 63a, 63b for receiving the fin unit 40 therein. The top cover 61 of the housing 60 forms an upper contacting surface 610 facing the chamber 68 between the two inner surfaces 630, whilst the bottom cover 62 forms a lower contacting surface 620 facing the chamber 68 between the two inner surfaces 630 of the two plates 63a, 63b. The upper and lower contacting surfaces 610, 620 are perpendicular to the inner surfaces 630 of the two plates 63a, 63b. Top ends of the left and right plate 63a, 63b connect with left and right sides of the top cover 61 and form two upper junctions at their joint portions, respectively. Bottom ends of the left and right plates 63a, 63b connect with left and right sides of the bottom cover 62 and form two lower junctions at there joint portions, respectively. A groove 69 is defined in the two plates 63a, 63b corresponding to each of the joint junctions.

Figure 3:
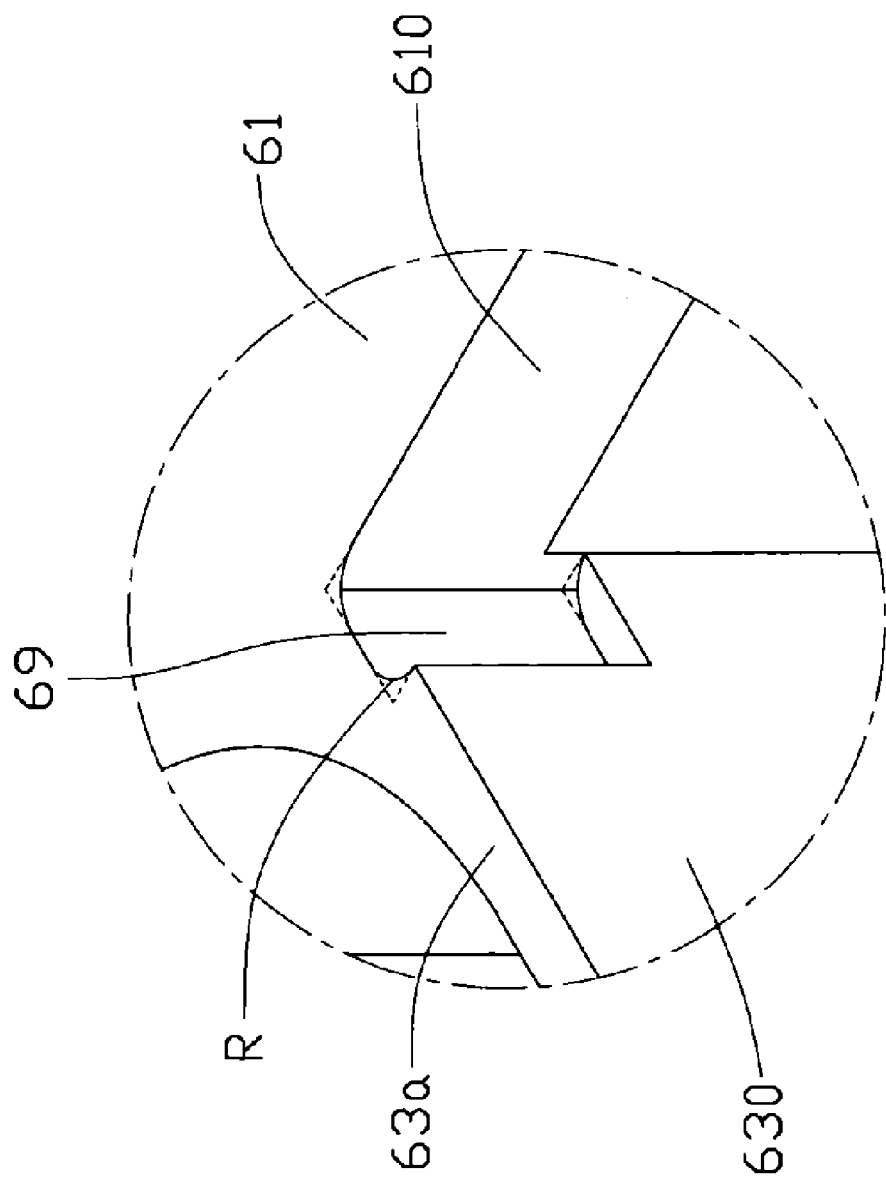
FIG. 3 is an enlarged view of a circled portion III of FIG. 1.
Figure 4:
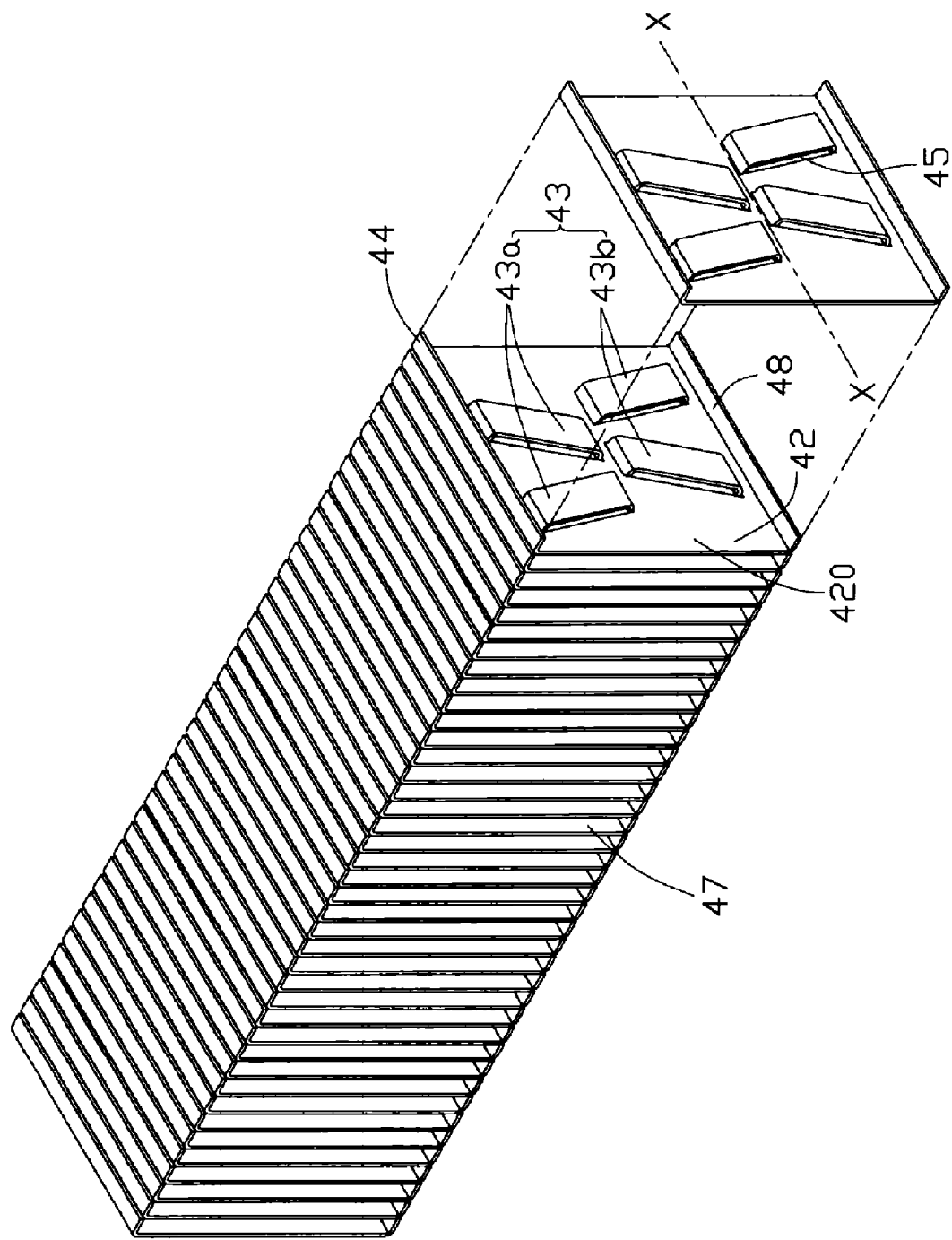
FIG. 4 is a an assembled, isometric view of a fin unit of the heat dissipation device of FIG. 1 viewed from another aspect, with one of fins of the fin unit being omitted to clearly show the structure of the fins.

As shown in FIG. 3, the groove 69 defined in the top end of the left plate 63a corresponding to a left upper junction which is formed by the top cover 61 and the left plate 63a has a depth along a vertical direction larger than a thickness of the top cover 61, and thus the inner surface 630 of the left plate 63a is spaced from the upper contacting surface 610 of the top cover 61. Chamfer angles R are formed in the groove 69 of the top end of the left plate 63a at the junctions of any two intersectant surfaces. Similarly, the groove 69 defined in the top end of the right plate 63b corresponding to a right upper junction which is formed by the top cover 61 and the right plate 63b has a depth larger than the thickness of the top cover 61. Thus the inner surface 630 of the right plate 63b is spaced from the top cover 61 as is the inner surface 630 of the left plate 63a. Chamfer angles R are formed in the groove 69 of the top end of the right plate 63b at the junctions of any two intersectant surfaces. Also the grooves 69 in the bottom ends of the two plates 63a, 63b have the same shapes and functions as the grooves 69 in the top ends of the plates 63a, 63b. The inner surfaces 630 of the two plates 63a, 63b are spaced from the lower contacting surface 620 of the bottom cover 62. Chamfer angles R are formed in the bottom grooves 69 of the two plates 63a, 63b. In other words, the inner surfaces 630 of the two plates 63a, 63b are spaced from the contacting surfaces 610, 620 of the two covers 61, 62, and the chamfer angles R are formed in the grooves 69. The inner surfaces 630 and the contacting surfaces 610, 620 which face the chamber 68 are planar-shaped. A cut out 67 is defined in the bottom end of each of the two plates 63a, 63b for extension of the heat pipe 20 therethrough, and thus the bottom ends of plates 63a, 63b are step-shaped.

The fin unit 40 includes a plurality of stacked fins 41 parallel to each other. Each fin 41 has a square-shaped main body 42 defining an axis of symmetry X-X which extends along the direction of the airflow, and top and bottom hems 44, 48 bending from top and bottom edges of the main body 42, respectively. The main body 42 includes a base surface 420 and a reference surface 422 opposite to the base surface 420. Distal edges (not labeled) of the hems 44, 48 of each fin 41 contact with the reference surface 422 of an adjacent fin 41 when the fin unit 40 is assembled, and the height of these hems 44, 48 are thus equal to the distance between the two neighboring fins 41. A flow channel 47 is formed between the main bodies 42 of each fin 41 and its neighboring fin 41 to channel the airflow generated by the blower 50. The top hems 44 of the fins 41 cooperatively form a top surface (not labeled) of the fin unit 40, whilst the bottom hems 48 of the fins 41 form a bottom surface (not labeled) of the fin unit 40.

Four spaced protrusions 43 extend outwardly from the base surface 420 of the main body 42 of each fin 41. Alternatively, the protrusions 43 can also be formed on the reference surfaces 422 of the fins 41. Also the protrusions 43 can be arranged both on the base and reference surfaces 420, 422 of the fins 41. Each protrusion 43 is arranged slantwise to the direction of the airflow. The protrusions 43 includes two upper protrusions 43a arranged at a top side of the axis X-X which are adjacent to the top hem 44, and two lower protrusions 43b arranged at a bottom side of the axis X-X adjacent to the bottom hem 48 of the fin 41. The protrusions 43 are formed by punching or other means, thus simplifying manufacturing. A concave hole 46 is formed corresponding to the each of the protrusions 43 on the reference surface 422 of each fin 41. A slot 45 extending through each protrusion 43 along the flowing direction of the airflow is defined therein.

The flow channels 47 at the base and reference surfaces 420, 422 of the fins 41 communicate with each other through the concave holes 46 and the slots 45 to improve convection of the airflow between neighboring channels 47. Also the slots 45 do not have to extend through both leeward side and windward side of the protrusion 43, for example; the slots 45 can be defined only in either the leeward sides or the windward sides of the protrusions 43 to intercommunicate the neighboring channels 47. The protrusions 43 are arranged slantwise to each other. The two upper protrusions 43a are arranged with top ends away from each other and bottom ends close to each other. Conversely, the two lower protrusions 43b are arranged with top ends close to each other and bottom ends away from each other. The upper protrusions 43a are located ahead the lower protrusions 43b along the flowing direction of the airflow.

The heat pipe 20 includes a condensing section 22 and a evaporating section 21 at two opposite ends. The condensing section 22 of the heat pipe 20 extends through the cutouts 67 of the plates 63a, 63b and is thermally attached to the bottom surface of the fin unit 40. The evaporating section 21 is thermally attached to the heat-generating device. A base 30 is arranged between the heat-generating device and the evaporating section 21 of the heat pipe 20. The base 30 is triangular-shaped. A passage 31 is defined in a top portion of the base 30 for receiving the condensing section 22. The base 20 is made of metal having a high thermal conductivity, such as copper. The evaporating section 21 of the heat pipe 20 is thermally secured in the passage 31 by soldering.

When assembled, the fin unit 40 is mounted in the chamber 68 of the housing 60. The top surface of the fin unit 40 and the top surface of the top cover 61 are coplanar. The top hem 44 of an outmost fin 41 adjacent to the left plate 63a abuts the inner surface 630 of the left plate 63a, whilst the reference surface 422 of the main body 42 of the other outmost fin 41 adjacent to the right plate 63b abuts the inner surface 630 of the right plate 63b. The contacting surfaces 610, 620 of the two covers 61, 62 abut rear sides of the main bodies 42 of the fins 41. For the grooves 69 defined in the joint junctions of the plates 63a, 63b and the covers 61, 62, the chamfer angles R formed at the junction of the inner surfaces and the contacting surfaces of the housing of the conventional heat dissipation device are now formed in the grooves 69. The contacting surfaces 610, 620 and the inner surfaces 630 are planar-shaped, and interference between the chamfer angles R and the heat sink 10 is thus avoided. Thus the fin unit 40 can be mounted into the chamber 68 of the housing 60 conveniently and closely. Good fixation is thus achieved between the housing 60 and the fin unit 40. Also the heat sink 10 can be closely attached to the housing 60, leakage of the airflow therebetween is thus avoided. The airflow generated by the blower 50 can be sufficiently utilized to dissipate heat of the heat sink 10 absorbed from the heat-generating device.

During operation, the evaporating section 21 of the heat pipe 20 absorbs heat generated by the heat-generating device. The working fluid that is contained in the inner side of the heat pipe 20 absorbs the heat and evaporates substantially and moves to the condensing section 22. Evaporated working fluid is cooled at the condensing section 22 and condensed. The heat is released. Finally, the condensed working fluid flows back to the evaporating section 21 to begin another cycle. In this way, the working fluid can absorb/release amounts of heat. The heat generated by the heat-generating electronic device is thus transferred from the heat pipe 20 to the fins 41 almost immediately. As the airflow generated by the blower 50 passes through the flow channel 47 of the fins 41, due to the influence of viscosity a laminar air envelope will be form on the base and reference surfaces 422, 420 of the each fin 41. However, the four protrusions 43 arranged in the flow channel 47 act as a barrier, destroying the laminar air envelope formed on the surfaces 420, 422 of each fin 41 and forming a vortex around the barrier, causing turbulence in the airflow. Heat exchange effect between the airflow and the fins 41 is therefore improved. As well as this, the slots 45 defined in the protrusions 43 interconnect neighboring channels 47 of the fin 41, improving heat convection coefficient of the airflow. As a result of these innovations the heat-dissipating efficiency of the heat dissipation device 10 is thus increased.

While the invention has been described in connection with what is presently considered to be the most practical and preferred embodiment, it is to be understood that the invention is not limited to the disclosed embodiments, but, on the contrary, is intended to accommodate various modifications and equivalent arrangements. The heat dissipation device in accordance with the preferred embodiment of the present invention includes a housing 60 having two plates 63a, 63b extending thereof. The plates 63a, 63b define grooves 69 therein corresponding to the junctions of the plates 63a, 63b and the housing 60. Alternatively, the grooves 69 can be defined in the housing 60 corresponding to the junctions. As long as the contacting surfaces 610, 620 of the housing 60 and the inner surfaces 630 of the plates 63a, 63b are spaced from each other and thus are planar-shaped, interference of the housing 60 and the heat sink 10 can be avoided.

What is claimed is:

1. A heat dissipation device comprising:
   a heat sink for thermally connecting with a heat-generating device; and
   a blower for generating an airflow to the heat sink, the blower comprising:
      a housing and a motor received in the housing, the motor forming a plurality of blades therearound; the housing comprising a top cover, a bottom cover and a sidewall interconnecting between the top cover and the bottom cover, an air outlet being defined in the sidewall, the heat sink being disposed in the air outlet, at least one of the top cover and the bottom cover forming a contacting surface abutting a first side of the heat sink; and
      at least one plate extending outwardly from the sidewall of the housing beside the air outlet, the at least one plate having an inner surface abutting a second side of the heat sink neighboring the first side of the heat sink;
   wherein a groove is defined in a joint of the inner surface of the at least one plate and the contacting surface of the housing to avoid interference of the housing of the blower and the heat sink.

2. The heat dissipation device of claim 1, wherein the groove is defined in the inner surface of the at least one plate.

3. The heat dissipation device of claim 1, wherein the groove is defined in the contacting surface of the housing.

4. The heat dissipation device of claim 1, wherein the groove has a depth not smaller than a thickness of the contacting surface.

5. The heat dissipation device of claim 1, wherein the at least one plate comprises a pair of plates extending from two opposite sides of the sidewall, and the contacting surface is formed between the two plates.

6. The heat dissipation device of claim 1, wherein the heat sink comprises a plurality of stacked fins defining a plurality of channels between neighboring fins, each fin forming at least a protrusion defining a slot therein, the slot intercommunicating two neighboring channels of the fin.

7. The heat dissipation device of claim 6, wherein the at least a protrusion comprises four protrusions, the four protrusions comprising two upper protrusions arranged at a side of an axis which extends along the direction of the airflow of the fin, and two lower protrusions arranged at the other side of the axis, the two upper protrusions and the two lower protrusions being arranged with first ends adjacent to the axis being close to each other and second ends far away from the axis being positioned away from each other.

8. The heat dissipation device of claim 6, wherein the slot extends through the protrusion along the flowing direction of the airflow.

9. A heat dissipation device, comprising:
   a blower for generating an airflow, the blower comprising a housing defining an air inlet and an air outlet, and a motor received in the housing; and
   a heat sink arranged at the air outlet of the blower;
   wherein the housing comprises a cover forming a first surface abutting a first side of the heat sink, a bottom wall and a sidewall extending from an outer periphery of the cover and interconnecting between the cover and the bottom wall, at least one plate extending outwardly from the sidewall and forming a second surface abutting a second side of the heat sink, the second side being perpendicular to the first side of the heat sink, a groove being defined in a junction of the at least one plate and the cover to separate the first surface of the cover and the second surface of the at least one plate.

10. The heat dissipation device of claim 9, wherein the groove is defined in the at least one plate.

11. The heat dissipation device of claim 9, wherein the groove is defined in the cover of the housing.

12. The heat dissipation device of claim 9, wherein the heat sink includes a plurality of stacked fins defining a plurality of channels between any two neighboring fins, each fin forming at least one protrusion defining a slot therein, the slot intercommunicating with two neighboring channels of the fin.

13. The heat dissipation device of claim 9, wherein there are four protrusions, the four protrusions comprising two upper protrusions arranged at a side of an axis which extends along the direction of the airflow of the fin, and two lower protrusions arranged at the other side of the axis, and wherein the two upper protrusions and the two lower protrusions are arranged with first ends adjacent to the axis positioned close to each other and second ends far away from the axis positioned away from each other.

14. A heat dissipation device comprising:
   a blower comprising a monolithic housing defining an inlet and an outlet, wherein an airflow generated by the blower flows from the inlet to the outlet, the housing having a top wall in which the inlet is defined, a bottom wall, a side wall between the top wall and the bottom wall and in which the outlet is defined, and a pair of opposite side plates extending outwardly from the side wall beside the outlet; and
   a heat sink mounted adjacent to the outlet and between the side plates, wherein four grooves are defined in joint junctions between the side plates and the top and bottom walls around the outlet, respectively.

15. The heat dissipation device of claim 14, wherein the heat sink comprises a plurality of fins stacked together and a heat pipe thermally connected to a bottom of the fins, the fins defining a plurality of channels therebetween.

16. The heat dissipation device of claim 15, wherein each of the fins forms at least a protrusion thereon, the at least a protrusion defining a slot extending therethrough to communicate two neighboring ones of the channels.

17. The heat dissipation device of claim 16, wherein the heat pipe comprises an evaporating section thermally connected to a base for thermally attaching to a heat generating electronic component.

\* \* \* \* \*